INVENTOR.
WALFRED R. RAISANEN
BY Thomas J. Nikolai
ATTORNEY

INVENTOR.
WALFRED R. RAISANEN
BY Thomas J. Nikolai
ATTORNEY

United States Patent Office 3,289,012

Patented Nov. 29, 1966

3,289,012

PULSE CIRCUIT GENERATING UNDERLAPPED CLOCK PULSES EMPLOYING TWO CONTROLLED SEMICONDUCTIVE SWITCHES COUPLING TWO TUNNEL DIODES

Walfred R. Raisanen, St. Paul, Minn., assignor to Sperry Rand Corporation, New York, N.Y., a corporation of Delaware Filed Jan. 20, 1964, Ser. No. 338,720
3 Claims. (Cl. 307—88.5)

This invention relates generally to electrical pulse forming circuitry and more specifically to a shaping circuit for converting a sinusoidal input signal into rectangular pulses having extremely sharp leading and trailing edges.

Most present day computers are synchronous machines in which the computations and data manipulations are performed under control of a master clock which establishes the rate at which signals representing information are processed through the logic circuits of the computer. Because the computational rate is dependent upon the speed of operation of the clocking circuits, it is essential that means be provided for speeding up the clock frequency if one is to obtain lower and lower instruction execution times in the computer.

In the past transistors have been employed in computer clock circuits. There are, however, several major limitations to the speed of transistor switching circuits. Examples of these limitations are carrier storage delays, where the transistors are operated in saturation; the limitations imposed by transistor and circuit capacitances; the $\alpha$ of the transistor; and the transistor diffusion or transit time delay. It has been found that several of the above limitations of transistor switching circuits are alleviated when the transistors are operated in a region away from saturation. However, not all of the limitations of the transistor switch may be obviated by using this technique.

The present invention provides a circuit in which the output signals have a rise time which is independent of the parameters of the transistor switch. This is accomplished by using tunnel diodes in place of the normal resistor load elements found in prior art pulse shaping circuits. In one embodiment of the invention the transistor controls the flow of current from a constant current source through the tunnel diode load. The input signal to be shaped is the control signal applied to the base of the transistor. With this arrangement, it is possible to obtain output signals whose rise time is independent of the transistor parameters and which can be made arbitrarily short, within the limits of the rise time characteristics of available tunnel diodes. In the present state of technology, tunnel diodes are available with rise time characteristics which are less than 0.1 nanoseconds ($0.1 \times 10^{-9}$ seconds).

It is accordingly an object of the present invention to provide new and improved pulse shaping circuits for converting sinusoidal input signals to rectangular pulses having extremely short rise times.

Another object of this invention is to provide a pulse shaping circuit wherein the rise time of the output signal is independent of the transistor parameters.

A further object of the invention is to provide a pulse shaping circuit which utilizes a tunnel diode as the load element in a constant current switching network such that the rise time of the output signal is limited only by the characteristics of the tunnel diode and not by those of the transistor.

In clocking circuits for digital computers, it is desirable that successive clock pulses be underlapped in time. In other words, the circuit for providing clocking signals should produce successive series of pulses which are not concurrent. Accordingly, it is another object of this invention to provide a shaping circuit for converting sinusoidal input signals to pulse type output signals which do not overlap each other on the time scale.

Further objects and advantages of the present invention will be apparent from the following description, reference being made to the accompanying drawings wherein the preferred embodiments of the present invention are clearly shown.

Figure 1:
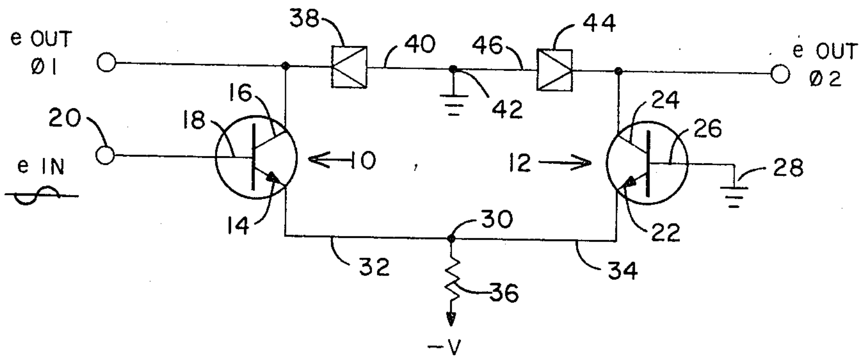
FIG. 1 is a schematic diagram of an electrical circuit made in accordance with this invention.

Referring now to FIG. 1 there is shown first and second semiconductor current controlling devices, here illustrated as transistors 10 and 12. The transistor 10 has a pair of output electrodes, the first output of the electrode being the emitter 14 and the second output electrode being the collector 16. The control electrode for the transistor 10 is the base electrode 18 which is connected to the input terminal 20 of the circuit. In a similar manner, the transistor 12 also has a pair of output electrodes 22 and 24 and a control electrode 26. The control electrode 26, however, is connected to a point of fixed potential such as ground 28.

The emitter electrodes 14 and 22 of the transistors 10 and 12 are connected in common at a junction point 30 by means of the conductors 32 and 34, respectively. The junction 30 is connected through a resistor 36 to a source of negative potential.

The collector electrode 16 of transistor 10 is connected to the cathode of a tunnel diode 38. The anode electrode of the tunnel diode 38 is connected by a conductor 40 to a grounded junction point 42. Similarly, the collector electrode 24 of the transistor 12 is connected to the cathode of the tunnel diode 44 whose anode is connected by way of conductor 46 to the grounded junction point 42.

A first output, termed the $\phi 1$ output, is taken at the junction between the collector electrode 16 and the cathode of the tunnel diode 38. A second output termed the $\phi 2$ output, is obtained at the junction between the collector electrode 24 of transistor 12 and the cathode of the tunnel diode 44.

Before explaining the operation of the circuit of FIG. 1, consideration will first be given to the characteristics of tunnel diodes. This will aid in the understanding of the operation of the circuit previously described.

The conductivity of a sample of pure semi-conductor crystal, such as germanium or silicon, is very low. This conductivity can be increased to that of a reasonably good semi-conductor by the controlled insertion into the crystal of impurity atoms, such as gallium or arsenic. The higher the impurity density established within the crystal, the higher the conductivity.

Depending upon whether there is an n-type or p-type impurity, conduction takes place predominately by motion of negatively charged carriers (electrons) or positively charged carriers (holes). Under certain conditions, these charges can behave essentially like particles. If one half of the crystal sample is doped with a p-type material and the other half with an n-type, the sample will conduct very heavily in one direction and very poorly in the opposite direction. This gives the typical diode characteristics achieved with semi-conductors.

The cross-sectional planes dividing the two regions of opposite-type impurities is known as the p-n junction. As a consequence of the difference in impurity type on either side of the junction, there is formed an extremely narrow electrically dipole region at the junction. This is caused by impurity atoms, which have gained or lost an electron. This dipole region gives rise to a potential barrier at the junction, which prevents current from flowing across the junction, i.e., without bias voltage being applied to the sample. In a conventional p-n diode, the number of charged carriers which can diffuse and drift over the barrier can be varied by changing the height of this barrier with an applied bias potential. Thus, when the diode is forward biased, the barrier is lowered and a large current flows. When the barrier is raised by the application of a bias of the opposite polarity a much smaller reverse current is forced through the junction.

If the concentration of impurities is increased sufficiently, to the order of $10^{19}$ to $10^{20}$/cubic centimeters, a new mechanism of charge flow is introduced. Not only is it possible for some carriers to flow over the barrier in the fashion previously mentioned, but also through it. That is to say, carriers which do not possess sufficient energy to surmount the barrier are, nevertheless, able to get to the other side by "tunneling" through it.

Figure 2:
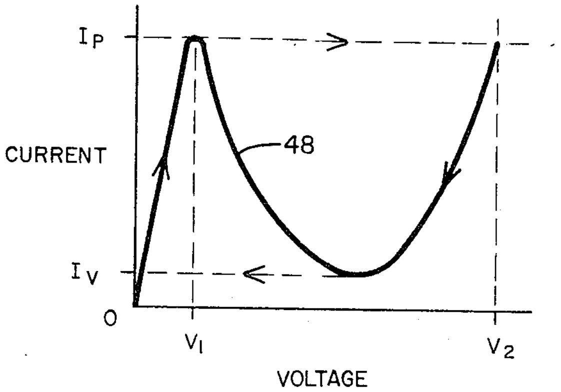
FIG. 2 illustrates the voltage-current characteristics of a typical tunnel diode.

FIG. 2 illustrates the typical tunnel diode volt-ampere characteristics. As is shown, as the voltage across the diode is increased from zero the current flowing through the diode rises quite sharply to a peak value $I_p$. When the voltage is increased still further, a negative resistance region 48 is observed. Since this is an unstable region, the voltage across the diode must be substantially increased to a value $V_2$ in order to substain the same level of current flowing through the tunnel diode. Thus it can be seen that a tunnel diode will exhibit two stable states shown in FIGURE 2 at the points marked $V_1$ and $V_2$, respectively. It should be emphasized that the values $V_1$ and $V_2$ are for a tunnel diode in series with an extremely low impedance.

Figure 3:
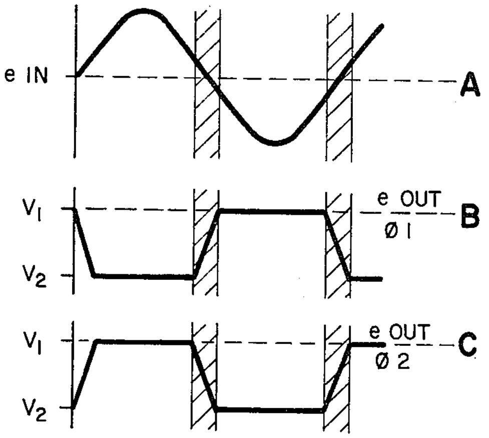
FIG. 3 illustrates the waveform obtained at the output terminals of the circuit of FIG. 1.

With the above features of the tunnel diodes behavior in mind, consideration will next be given to the operation of the pulse shaping circuit of FIG. 1. To better understand the operation of this circuit reference is also made to the waveforms of FIG. 3.

With no input signal applied to the input terminal 20, the transistor 12 will be forward biased, i.e., with base current flowing from the ground terminal of the source through the base to emitter junction of the transistor 12, through conductor 34 and resistor 36 to the negative terminal of the supply source. With this base current flowing the transistor 12 will be at least partially conductive and a substantially larger current will flow from the grounded terminal of the source through the conductor 46, the tunnel diode 44 and from the collector 24 to the emitter 22 of the transistor 12, through conductor 34 and resistor 36 to the negative terminal of the supply. The resistor 36 in series with the voltage source —V comprises a constant current source. With the transistor 12 conducting as described above, the tunnel diode will be at its operating point $V_2$ such that the $\phi 2$ output terminal will be at a relatively negative potential with respect to ground. Because no input signal is applied to the transistor 10 this transistor will be nonconducting and the $\phi 1$ output signal will be approximately 0 volt.

As the input signal applied to the terminal 20 begins to swing positive, the transistor 10 will be rendered more and more conductive until the current flowing from the junction 42 through the tunnel diode 38 and the transistor 10 and through the resistor 36 to the source —V reaches the limiting value $I_p$. When this value of current is exceeded the voltage across the tunnel diode 38 suddenly shifts to the value $V_2$. Because the transistor 10 may be considered as an emitter follower, as the input signal swings positive the junction 30 will also become more positive tending to back bias the transistor 12 and prevent conduction therethrough. Hence, the tunnel diode 44 will be operating in the range of voltages below the point $V_1$.

At the completion of the first half cycle of the input signal the situation will be reversed with transistor 10 being rendered more and more non-conductive and transistor 12 being rendered more and more conductive. Hence the constant current flowing in the circuit will be shifted from the branch including the tunnel diode 38 to the branch containing tunnel diode 44. When transistor 12 is rendered sufficiently conductive to exceed the threshold of the tunnel diode, the voltage at the $\phi 2$ output terminal will again jump rapidly to the value $V_2$. This condition will be maintained until the input signals again starts its positive excursion at the beginning of the second cycle of the input signal.

Because the transistors 10 and 12 need only be rendered sufficiently conductive to permit a current greater than the value $I_p$ to flow through the tunnel diode to cause a substantial change in the output signal, the output signal may be considered to be independent of the parameters of the transistors themselves. The rise times of the output signals are limited only by the characteristics of the tunnel diodes. Tunnel diodes currently on the market exhibit rise time characteristics which are less than 0.1 nanosecond. Thus, the circuit of FIG. 1 is effective to shape the sinusoidal input signal into rectangular pulses having extremely sharp rise time characteristics. It may also be seen from FIG. 3, that the circuit of FIG. 1 results in an overlap of the $\phi 1$ and $\phi 2$ output signals. This region of overlap is shaded in the illustration of FIG. 3. Because in some computer applications it is generally desirable that the clocking signals not be overlapped in time, the circuit of FIG. 1 may be modified to produce this underlapped condition. The second embodiment of the invention incorporating means for preventing the overlap of the $\phi 1$ and $\phi 2$ signals is illustrated in FIG. 4.

Figure 4:
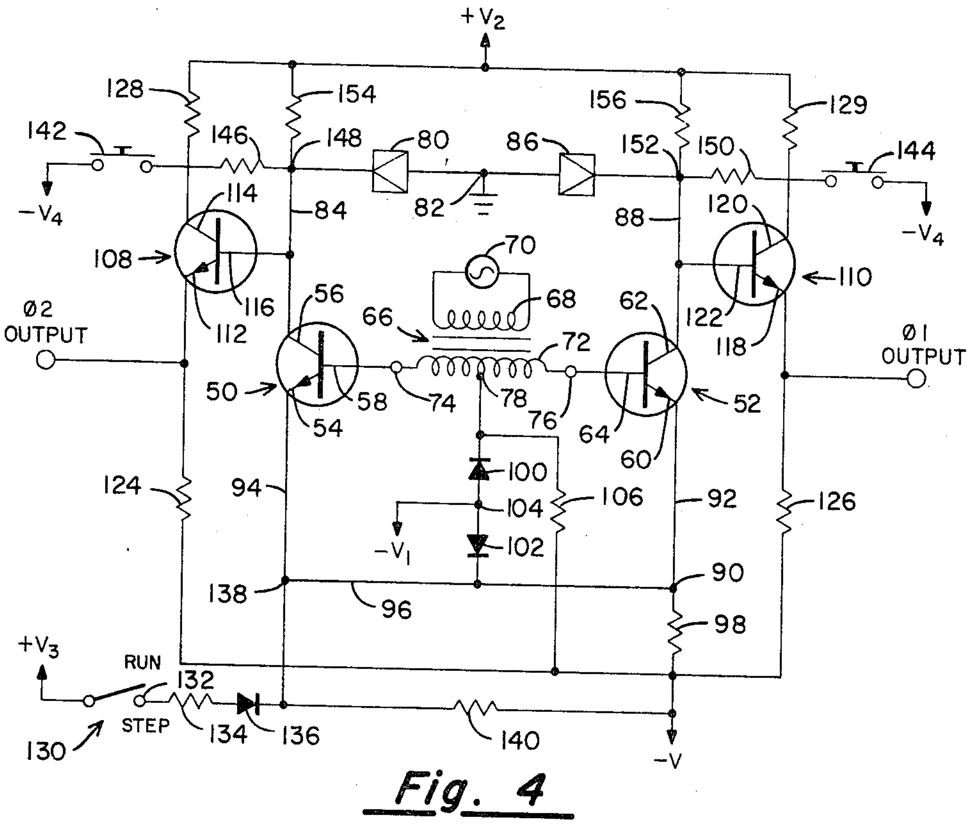
FIG. 4 is a schematic diagram of another embodiment of the pulse shaping circuit of this invention.

Before the operation of the circuit of FIG. 4 is described in detail, consideration will first be given to its layout and construction. The circuit of FIG. 4 includes a first pair of semi-conductor current controlling devices, here shown as transistors 50 and 52. The transistor 50 has an emitter electrode 54, a collector electrode 56 and a base electrode 58. The transistor 52 has an emitter electrode 60, a collector electrode 62, and a base electrode 64. The base electrodes 58 and 64 are adapted to be driven by signals which are 180° out of phase with respect to one another. The means employed in the preferred embodiment of this invention is a transformer 66 having a primary winding connected across a source of alternating current 70 and a secondary winding 72 having first and second terminals 74 and 76 and a center tap terminal 78. The base electrode 58 of transistor 50 is connected to the secondary winding terminal 74 while the base electrode 64 of transistor 52 is connected to the secondary winding terminal 76.

A first tunnel diode 80 is connected between a point of fixed potential such as ground 82 and the collector electrode 56 of transistor 50 by means of a conductor 84. In a like manner, a tunnel diode 86 is connected between the ground terminal 82 and the collector electrode 62 of transistor 52 by means of conductor 88.

The emitter electrodes 54 and 60 are connected in common to a junction point 90 by means of conductors 92, 94 and 96. The common junction 90, in turn, is connected to a resistor 96 to a suitable source of negative potential V. The resistor 96 being in series with the source —V constitutes a constant current source for the circuit of FIG. 4.

Connected between the center tap terminals 78 and a common junction 90 are a pair of oppositely poled diodes 100 and 102. The common junction 104 between the anode electrodes of the two diodes is adapted to be connected to a suitable source of negative bias potential $V_1$. For reasons which will become apparent later on when the operation of the circuit of FIG. 4 is described, the diode 100 is preferably a silicon diode whereas the diode 102 is preferably a germanium diode. A resistor 106 connects the center tap terminal 78 to the source of negative potential V.

In order to provide sufficient power gain so that the clock signal shaping network can provide signals to a large plurality of logic circuits, there is included in the circuit of FIG. 4 a pair of emitter follower amplifiers which include the transistors 108 and 110. The transistor 108 has an emitter electrode 112, a collector electrode 114 and a base electrode 116. The transistor 110 has an emitter electrode 118, a collector electrode 120 and a base electrode 122. The emitter electrodes 112 and 118 are respectively connected through resistors 124 and 126 to the source of negative potential (—V). The collector electrodes 114 and 120 of transistors 108 and 110 are respectively connected through resistors 128 and 130 to a point of positive potential $V_2$. The resistors 128 and 130 are of relatively low ohmic value and serve to protect the emitter follower transistors 108 and 110 from drawing an excessively high current which might cause damage to the transistors.

In actual computing systems it is often desirable to control the source of clock signals so that it is possible to manually sequence through a program or series of operations one step at a time. Circuitry is provided in the apparatus of FIG. 4 to allow for manual generation of shaped clocked pulses. This circuitry includes means for overriding the normal bias on the transistors 50 and 52 to maintain them both non-conductive and also means for manually switching one or the other of the tunnel diodes 80 and 86. The means for rendering the transistors 50 and 52 non-conductive includes the single pole double throw manual switch 130, the pole of which is connected to a source of positive voltage $V_3$. The switch contact 132 is connected through a resistor 134 and a diode 136 to a junction 138 formed between conductors 94 and 96. Hence, when the switch is thrown to the step position for manual operation, the emitter electrodes 54 and 60 of the transistors 50 and 52 are maintained at a sufficiently positive potential to prevent the transistors from becoming conductive. More specifically, the potential applied to the emitter electrodes is consistently more positive than the signal being applied to the base electrodes 58 and 64 by the transformer 66 driven by the source of alternating current signal 70. A resistor 140 which is connected between the cathode electrode of the diode 136 and the source of negative potential —V acts in conjunction with the resistor 134 to form a voltage divider such that a positive bias potential of a desired value is developed at the junction 138 to hold the transistors non-conductive.

In order to manually produce the $\phi 1$ and $\phi 2$ output signals at the output terminals of the emitter follower transistors 108 and 110, a pair of switches 142 and 144 are included in the circuit of FIG. 4. When the switch 142 is closed, a source of negative potential $-V_4$ is connected through a resistor 146 to the junction 148 between the cathode electrode of the tunnel diode 80 and the conductor 84. In a similar manner, when the switch 144 is closed, a source of negative potential $-V_4$ is connected through a resistor 150 to a junction 152 between the cathode electrode of tunnel diode 86 and the conductor 88. A resistor 154 which is connected between the junction 148 and the point of positive potential plus $V_2$ acts with the resistor 146 as a voltage divider for producing a desired value of potential at the junction 148 when the switch 142 is closed. In a similar manner, a resistor 156 connected between the junction 152 and the source of positive voltage plus $V_2$ acts with the resistor 152 to form a voltage divider.

Before describing the operation of the circuit of FIG. 4 it is deemed expedient to suggest typical voltage values and component values for the circuit. The following table lists typical values used in the preferred embodimnt of the present invention. However, it is to be understood that other values may be employed without departing from the spirit and scope of the invention, it being understood that the values listed are merely illustrative.

Resistor 98, 220 ohms, transistor 52 type 2N2368
Resistor 106, 1000 ohms, transistor 108 type 2N2368
Resistor 124, 100 ohms, transistor 110 type 2N2369
Resistor 126, 100 ohms, tunnel diode 80 type TD104
Resistor 128, 39 ohms, tunnel diode 86 type TD104
Resistor 130, 39 ohms, silicon diode 100 type 1N914
Resistor 134, 120 ohms, germanium diode 102 type V908202
Resistor 140, 10,000 ohms, diode 136 type 1N914
Resistor 146, 220 ohms, V——5.2 v.
Resistor 150, 220 ohms, $V_1$——2 v.
Resistor 154, 330 ohms, $V_2$—+3 v.
Resistor 156, 330 ohms, $V_3$—+3 v.
Transistor 50 type 2N2368, $V_4$——5.2 v.

OPERATION—FIG. 4

The manner in which the circuit of FIG. 4 operates to convert a sinusoidal input signal to sets of underlapped rectangular wave signals will now be described.

With the switch 130 in the run position and the source 70 of alternating current generating a sinusoidal input signal for the transistors 50 and 52, these two last mentioned transistors will be alternately and sequentially rendered conductive and non-conductive. More specifically, with transistors 50 and 52 being silicon transistors type 2N2368, they will conduct when forward biased by 0.8 volts. The center tap terminal 78 of the transformer secondary winding 72 is normally held at approximately —1.2 volts by the source of bias potential $-V_1$ and the drop across the silicon diode 100. The emitter electrodes 92 and 94, however, are normally maintained at a potential of —1.7 volts by the bias source $-V_1$ and the voltage drop across the germanium dioxide 102. Hence, it can be seen that in order to cause the transistors 50 or 52 to be conductive an input signal of approximately +0.3 volt must be applied to the base electrode of the transistor.

Because of the transformer arrangement employed, input signals of equal amplitude but opposite polarity will be applied to the base electrodes 58 and 64. Therefore, as the input signal at the base of transistor 50 begins a positive excursion, both transistors will remain non-conductive until the base electrode 58 of transistor 50 receives an input signal of +0.3 volt. As this value is exceeded, the transistor 50 will be forward biased and there will be an increase in the current flowing from the grounded junction 82 through the tunnel diode 80, the conductor 84, the collector to emitter path of the transistor 50, the conductor 94, the conductor 96, and the resistor 98 to the source of negative potential —V. This current is sufficient to exceed the peak current $I_P$ of the tunnel diode, and accordingly, the signal applied to the base electrode 116 of the emitter follower transistor 108 will snap suddenly to a relatively high negative potential, tending to cut off the conduction in transistor 108. As a result, the $\phi 2$ output signal will suddenly become substantially more negative in potential than is the case when the transistor 50 is non-conducting. Because when the input signal to transistor 50 is positive, the input to transistor 52 is negative, transistor 52 will be maintained non-conductive during the entire first half cycle of the input signal.

Transistor 50 will remain in its conductive condition until the input signal again drops below the +0.3 volt value. At this time the tunnel diode 80 will have the current flowing therethrough decreased as the transistor 50 is driven into its non-conductive state. As the current drops below the value $I_V$, the transistor 108 will again become highly conductive and the $\phi 2$ output signal will swing sharply in the positive direction. As the input signal at the base electrode 58 goes in a negative direction from the 0.3 volt value, both transistors 50 and 52 will be simultaneously non-conducting until the point is reached where a normal D.C. bias applied to the transistor 52 is overcome, at which time transistor 52 becomes conductive. In the same way as was described for the transistor 50, as the transistor 52 becomes conductive there is an increase in current flow from the grounded junction 82 through the tunnel diode 86, through the conductor 88, through the collector to emitter path of the transistor 52, through conductor 92 and the resistor 98 to the source of negative potential —V. Again when the transistor 52 permits a current to flow greater than the value $I_P$, the tunnel diode 86 will be switched from its $V_1$ to its $V_2$ state (See FIG. 2) and the emitter follower transistor 110 will suddenly be rendered non-conductive. As transistor 110 ceases to conduct the $\phi 1$ output signal obtained at the junction between the emitter electrode 118 of transistor 110 and the resistor 126 will swing in the negative direction. The output signal will remain at this negative level until the input signal to the base of transistor 52 drops below the 0.3 volt value. At this time transistor 52 will again be turned off and the tunnel diode 86 will cease to carry sufficient current to exceed the critical value $I_V$. As before, both transistors will remain non-conductive until the input signal applied to the transistor 50 again swings past the 0.3 volt value on the second cycle of the input signal.

Figure 5:
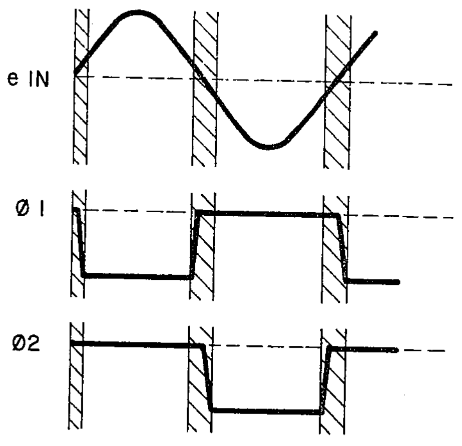
FIG. 5 illustrates the waveform of the signals obtained at the output terminals of the circuit of FIG. 4.

Referring to FIG. 5, there is illustrated the input signal waveform and the resulting $\phi 1$ and $\phi 2$ output signals. It can clearly be seen from this illustration that $\phi 1$ and $\phi 2$ output signals are underlapped in time due to the threshold values established by the negative voltage source $V_1$ and the diodes 100 and 102.

In order to manually step the $\phi 1$ and $\phi 2$ output signals, the operator first closes the switch 130 such that a positive potential ($+V_3$) is applied by way of the voltage divider which includes resistors 134 and 140 and the diode 136 to the emitter electrodes 54 and 60 of transistor 50 and 52. The value of the voltage applied to the emitter electrodes is sufficiently positive to preclude the input signal from the source 70 and the transformer 66 from turning on the transistors. With the switch closed to the STEP position, then, the circuit operation may be considered as if the transistors 50 and 52 and their associated bias and supply connections are not present. The operator may manually produce a $\phi 2$ output signal by depressing the switch 142 to close the contacts. When the switch is closed a relatively high negative potential ($V_4$) is applied to the cathode electrode of the tunnel diode 80. The tunnel diode will therefore conduct sufficient current from the point of fixed potential 82 through the diode and the resistor 146 to the source $V_4$. The current is sufficient to exceed the critical value $I_p$. Hence, the voltage across the diode will suddenly snap to the value $V_2$ (FIG. 2). As was previously described, when the tunnel diode is in its $V_2$ state the transistor 108 will suddenly have a negative potential applied to its base electrode 116 causing it to be turned off. This, in turn, causes the $\phi 2$ output signal to swing sharply in a negative sense. When the switch 142 is again opened the current flowing through the tunnel diode 80 will cease and the tunnel diode will revert to its $V_1$ state (FIG. 2).

To produce a $\phi 1$ output signal, the operator must depress the switch 144 to complete a circuit from the grounded terminal 82 through the tunnel diode 86 and the resistor 150 to the source of negative voltage $V_4$. In the same way as was described when the switch 142 is closed, the transistor 110 this time will be turned off such that the $\phi 1$ output signal will swing sharply in a negative direction.

It should be noted that when the circuit of FIG. 4 is operating in either the RUN mode or the STEP mode as determined by the manual switch 130, the output signals at the $\phi 1$ and $\phi 2$ output terminals will be dependent upon the characteristics of the tunnel diodes 80 and 86 and independent of the switching characteristics of the transistors 50 and 52.

While particular embodiments of the present invention have been shown and described, it will be obvious to those skilled in the art that changes and modifications may be made without departing from this invention in its broader aspects, and, therefore, the aim in the appended claims is to cover all such changes and modifications that fall with the true spirit and scope of this invention. What is claimed is:

1. A pulse forming circuit for generating underlapped positive and negative going rectangular pulses having short rise and fall time characteristics comprising: first and second semiconductor current controlling means, each having an input electrode, an output electrode and a control electrode; a constant current source having first and second terminals; means connecting the input electrode of said first and second semiconductor current controlling means in common to the first terminal of said constant source; first and second tunnel diodes connected between the second terminal of said constant current source and respectively to the output electrodes of said first and second of semiconductor current controlling means; a source of cyclic input signals connected to the control electrodes of said first and second current control means for periodically and alternately rendering said first and second semiconductor current controlling means conductive and non-conductive on successive half-cycles of said source of input signals; and biasing means connected to said contol electrodes of said first and second semiconductor current controlling means for maintaining both of said semiconductor current control means simultaneously non-conductive for predetermined portions of each half cycle of the input signals from said source.

2. Apparatus as in claim 1 wherein said source of cyclic input signals includes a source of alternating voltage and a transformer having a primary winding and a center-tapped secondary winding, said primary winding being connected to said source of alternating voltage, and the opposite ends of said secondary winding being connected respectively to said control electrodes of said first and second semiconductor current control means, said biasing means being connected between said center-tap and said first terminal of said constant current source.

3. Apparatus as in claim 2 wherein said biasing means includes a silicon diode and a germanium diode having their anode electrodes connected in common to a source of fixed potential, the cathode of said silicon diode being connected to said center-tap and the cathode electrode of said germanium diode being connected to said first terminal of said constant current source.

References Cited by the Examiner

UNITED STATES PATENTS

| | | | |
|---|---|---|---|
| 3,211,921 | 10/1965 | Kaufman et al. | 307—88.5 |
| 3,215,854 | 11/1965 | Mayhew | 307—88.5 |
| 3,217,173 | 11/1965 | Strohmeier | 307—88.5 |

OTHER REFERENCES

1960 International Solid-State Circuits Conference Digest Technical Papers, pp. 16–17, Feb. 10, 1960, "Esaki-Diode Logic Circuits," by G. W. Neff et al.

ARTHUR GAUSS, *Primary Examiner.*

J. S. HEYMAN, *Assistant Examiner.*